(12) United States Patent
Yamase et al.

(10) Patent No.: US 11,505,133 B2
(45) Date of Patent: Nov. 22, 2022

(54) ATTACHMENT MEMBER AND VEHICLE

(71) Applicant: HONDA MOTOR CO., LTD., Tokyo (JP)

(72) Inventors: Shinichi Yamase, Tokyo (JP); Junya Adachi, Tochigi (JP)

(73) Assignee: HONDA MOTOR CO., LTD., Tokyo (JP)

( * ) Notice: Subject to any disclaimer, the term of this patent is extended or adjusted under 35 U.S.C. 154(b) by 183 days.

(21) Appl. No.: 17/155,190

(22) Filed: Jan. 22, 2021

(65) Prior Publication Data
US 2022/0234517 A1 Jul. 28, 2022

(51) Int. Cl.
*H05K 7/14* (2006.01)
*B60R 11/02* (2006.01)
*B60R 16/02* (2006.01)
*H04R 1/02* (2006.01)
*B60R 11/00* (2006.01)

(52) U.S. Cl.
CPC ...... *B60R 11/0247* (2013.01); *B60R 16/0215* (2013.01); *H05K 7/14* (2013.01); *B60R 2011/0003* (2013.01); *H04R 1/025* (2013.01)

(58) Field of Classification Search
CPC ............. B60R 11/0247; B60R 16/0215; B60R 2011/0003; H05K 7/14; H04R 1/025
USPC ...................................................... 361/807
See application file for complete search history.

(56) References Cited

U.S. PATENT DOCUMENTS

| | | | |
|---|---|---|---|
| 6,595,668 B2 | 7/2003 | Hatagishi et al. | |
| 6,669,501 B2* | 12/2003 | Serizawa ............ | B60R 16/0207 439/502 |
| 6,749,324 B2* | 6/2004 | Nagai ...................... | B60Q 3/51 362/396 |
| 6,899,449 B2 | 5/2005 | Hatagishi et al. | |
| 2001/0005083 A1* | 6/2001 | Serizawa ............ | B60R 16/0207 296/37.7 |
| 2002/0041496 A1 | 4/2002 | Hatagishi et al. | |
| 2003/0147249 A1* | 8/2003 | Hatagishi ................. | B60Q 3/82 362/488 |
| 2010/0080014 A1* | 4/2010 | Ichikawa ................. | B60Q 3/51 362/546 |

(Continued)

FOREIGN PATENT DOCUMENTS

JP 2002-079879 A 3/2002

*Primary Examiner* — Timothy J Thompson
*Assistant Examiner* — Michael F McAllister
(74) *Attorney, Agent, or Firm* — Thomas | Horstemeyer, LLP

(57) ABSTRACT

An attachment member is configured to support an electric component to which a harness is connected, and be attached to a wall portion of a vehicle interior. The member includes a base portion to which the electric component is fixed, a first engaging portion and a second engaging portion each standing on the base portion and configured to engage with the wall portion. Each of the first and second engaging portions includes a proximal-side end portion on a side of the base portion, and a distal end-side end portion opposite to the proximal-side end portion. The first and second engaging portions are arranged so as to sandwich a harness connecting portion of the electric component. The attachment member further includes a coupling portion configured to couple the distal end-side end portions of the first and second engaging portions.

9 Claims, 11 Drawing Sheets

(56) References Cited

U.S. PATENT DOCUMENTS

2010/0195348 A1* 8/2010 Ohtsuka .................. B60Q 3/51
362/546
2018/0281695 A1* 10/2018 Arasuna .................. H04R 1/08

* cited by examiner

ATTACHMENT MEMBER AND VEHICLE

BACKGROUND OF THE INVENTION

Field of the Invention

The present invention relates to an attachment member and a vehicle.

Description of the Related Art

As a structure for attaching an electric component to a wall portion of a vehicle interior, Japanese Patent Laid-Open No. 2002-079879 discloses a structure in which a unit main body supporting an electric component engages with an interior wall material. In this structure, a hook-shaped locking piece standing on the unit main body engages with the edge of a window formed in the interior wall material.

A harness is connected to the electric component. During attachment work of the unit main body to the interior wall material, the harness may be accidentally caught between the edge of the window and the locking piece. This may cause disconnection of the harness or improper attachment of the electric component.

SUMMARY OF THE INVENTION

It is an object of the present invention to prevent a harness from being accidentally caught during attachment work of an electric component.

According to an aspect of the present invention, there is provided an attachment member configured to support an electric component to which a harness is connected, and be attached to a wall portion of a vehicle interior, the member comprising: a base portion to which the electric component is fixed; and a first engaging portion and a second engaging portion each standing on the base portion and configured to engage with the wall portion; wherein each of the first engaging portion and the second engaging portion includes a proximal-side end portion on a side of the base portion, and a distal end-side end portion opposite to the proximal-side end portion, the first engaging portion and the second engaging portion are arranged so as to sandwich a harness connecting portion of the electric component, and the attachment member further comprises a coupling portion configured to couple the distal end-side end portion of the first engaging portion and the distal end-side end portion of the second engaging portion.

Further features of the present invention will become apparent from the following description of exemplary embodiments (with reference to the attached drawings).

DESCRIPTION OF THE EMBODIMENTS

Figure 1:
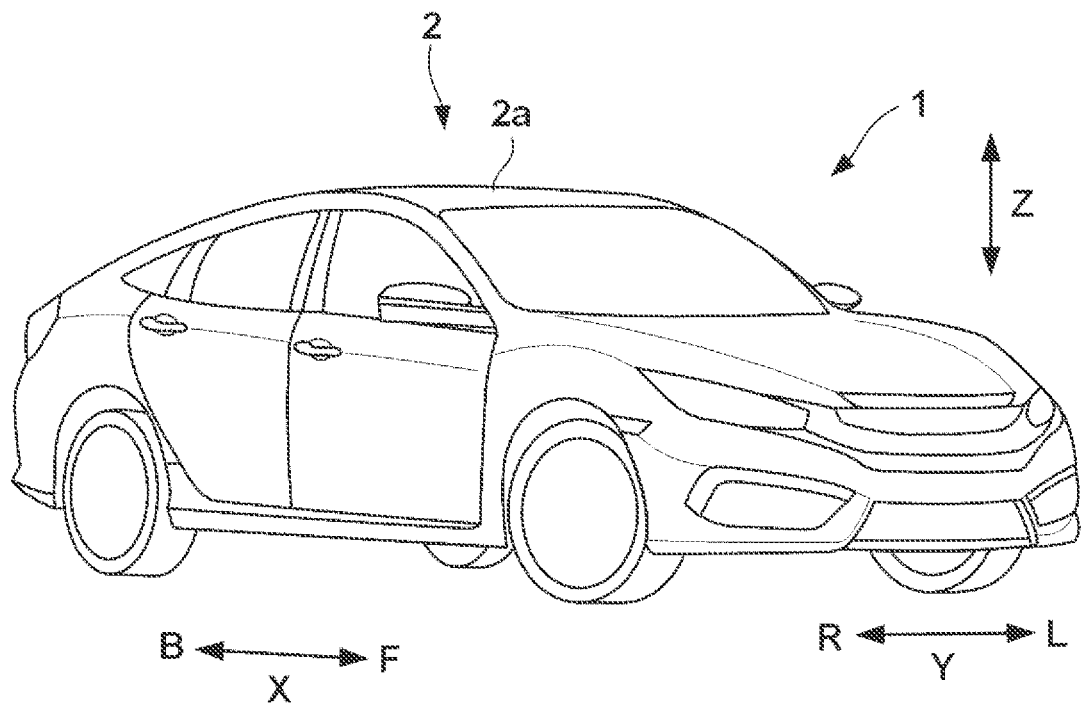
FIG. 1 is an external view of a vehicle according to an embodiment of the present invention.

Hereinafter, embodiments will be described in detail with reference to the attached drawings. Note that the following embodiments are not intended to limit the scope of the claimed invention, and limitation is not made an invention that requires all combinations of features described in the embodiments. Two or more of the multiple features described in the embodiments may be combined as appropriate. Furthermore, the same reference numerals are given to the same or similar configurations, and redundant description thereof is omitted.

FIG. 1 is an external view of a vehicle 1 according to an embodiment of the present invention. The vehicle 1 is, for example, a five-door four-wheeled passenger car, and FIG. 1 shows the front side and right side portion thereof. In each drawing, an arrow X indicates the front-and-rear direction of the vehicle 1, reference symbol F indicates the front side, and reference symbol B indicates the rear side. An arrow Y indicates the vehicle width direction (left-and-right direction) of the vehicle 1, reference symbol L indicates the left side, and reference symbol R indicates the right side. An arrow Z indicates the vertical direction.

Figure 2:
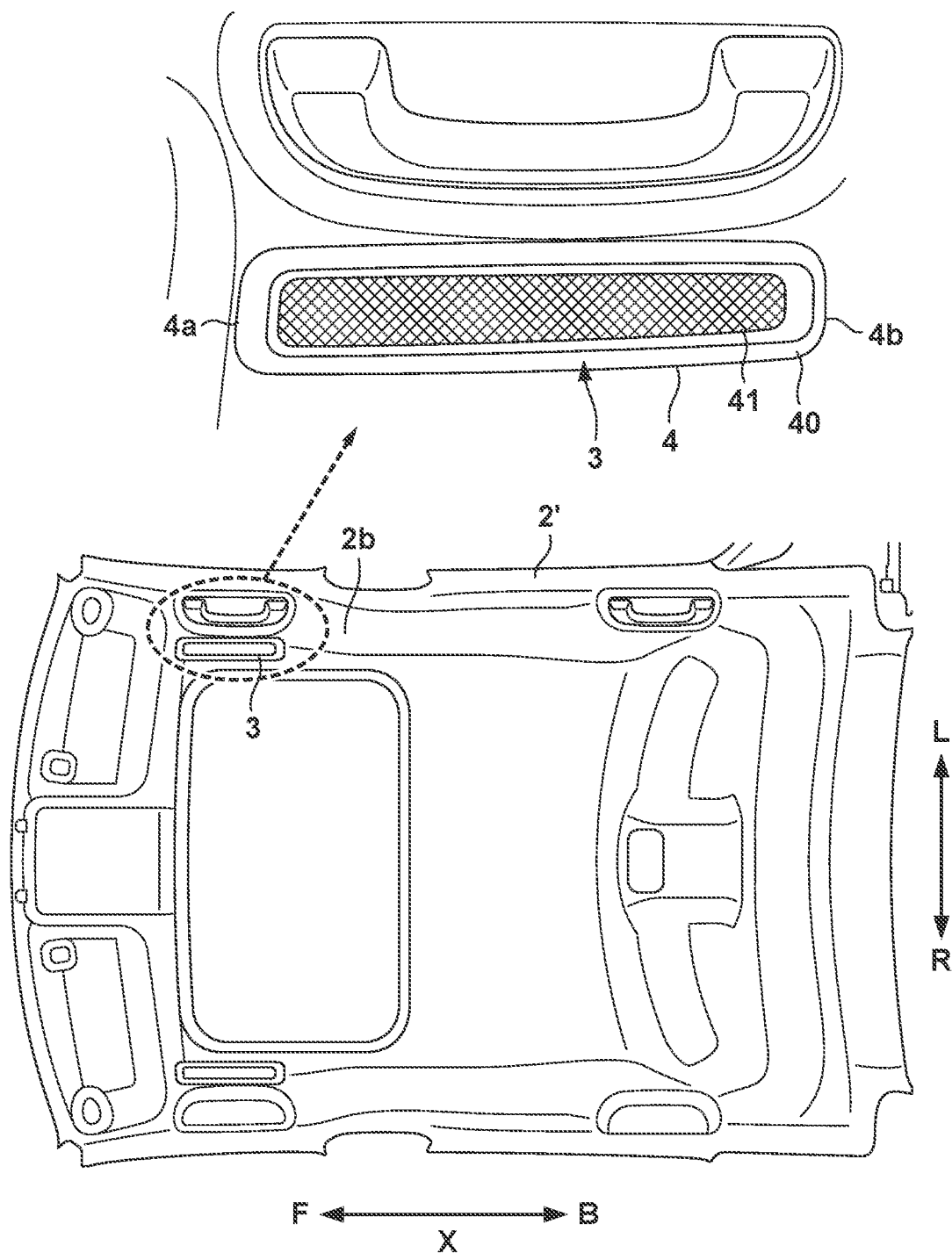
FIG. 2 includes a view showing the ceiling of the vehicle interior of the vehicle shown in FIG. 1, and a partially enlarged view thereof.

The vehicle 1 includes a roof portion 2. FIG. 2 includes a view showing a ceiling 2' of the vehicle interior of the vehicle 1, which is a view of the roof portion 2 when viewed from the vehicle interior side. FIG. 2 also includes a partially enlarged view of a part of the ceiling. An audio input/output device 3 is provided in the ceiling 2'. The audio input/output device 3 outputs audio to an occupant, and receives an input of a voice instruction from the occupant.

Figure 3:
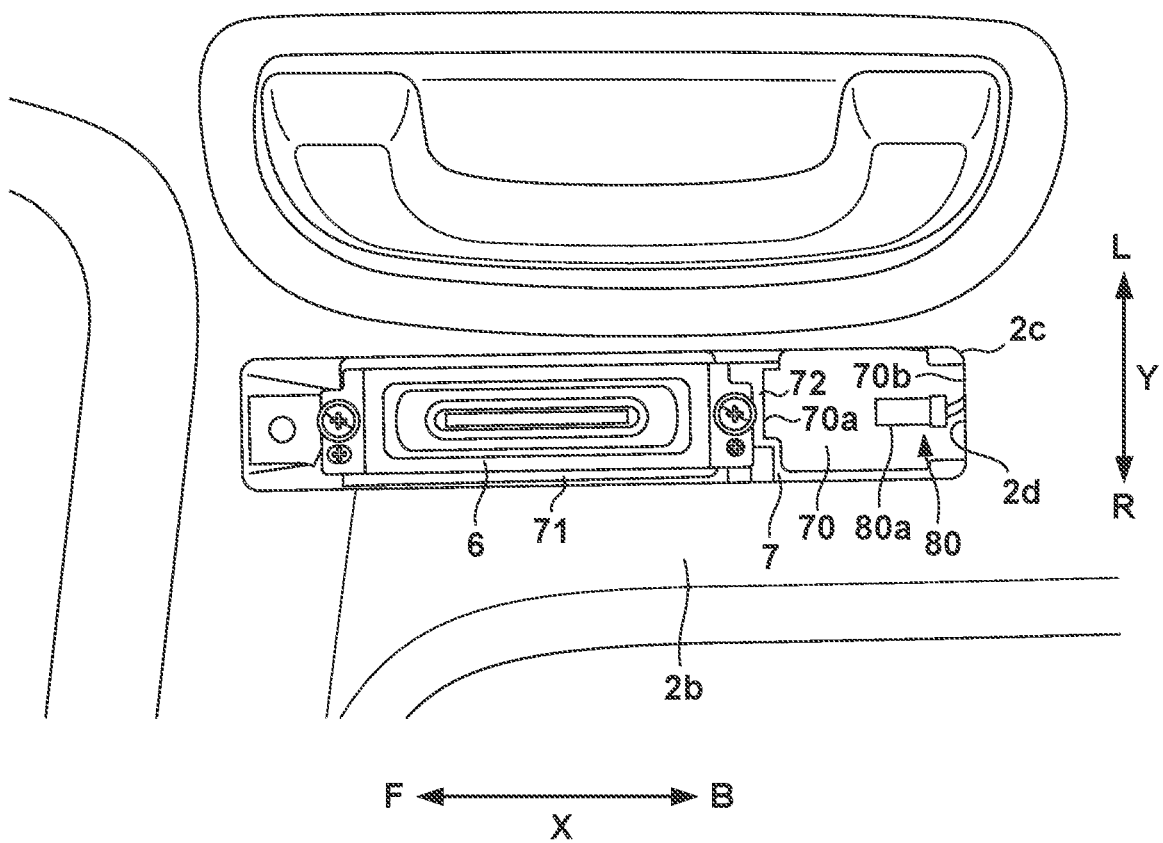
FIG. 3 is a view showing a mode in which a cover member of an audio input/output unit is removed in the partially enlarged view in FIG. 2.
Figure 4:
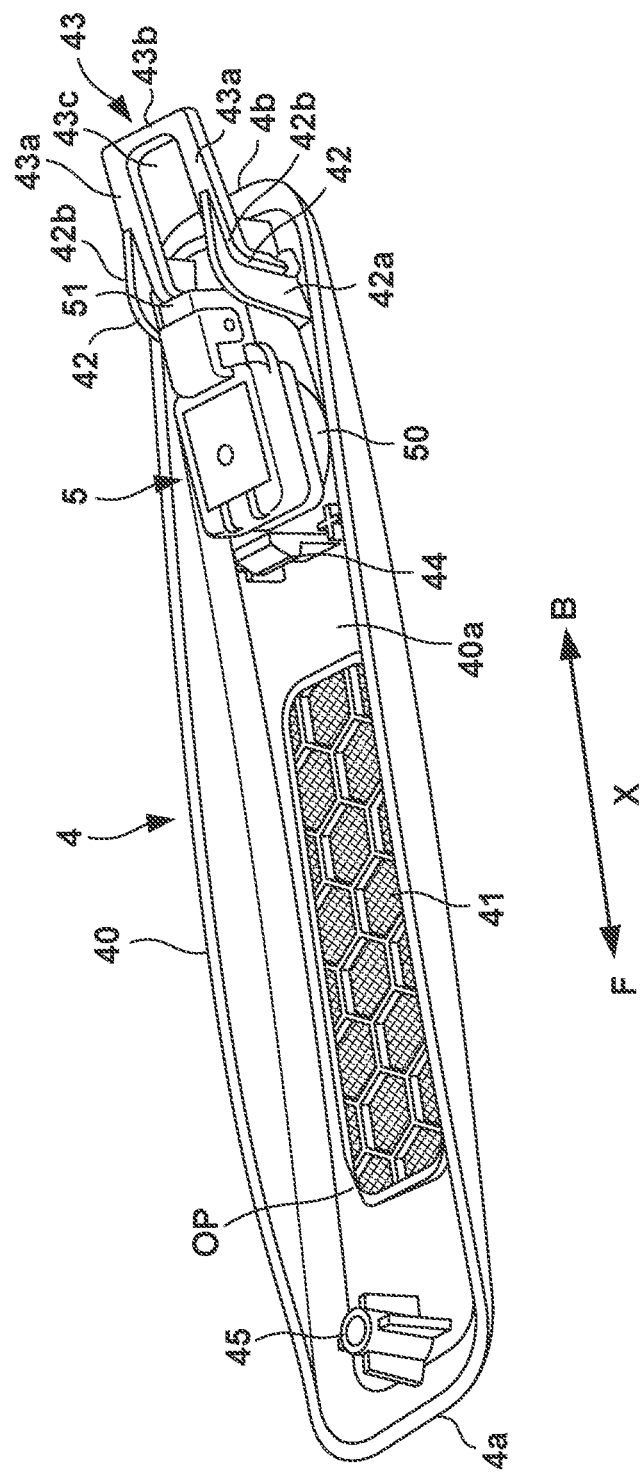
FIG. 4 is a perspective view of the cover member on the back surface side.

The audio input/output device 3 includes a cover member 4 including a mesh plate 41. FIG. 3 shows a mode in which the cover member 4 is removed, and FIG. 4 is a perspective view of the cover member 4 when viewed from the back surface side. The audio input/output device 3 includes a microphone 5 to which a voice instruction from the occupant is input, and a loudspeaker 6 that outputs audio to the occupant.

The microphone 5 is supported by the cover member 4. The cover member 4 forms the exterior of the audio input/output device 3 and supports the microphone 5 as an electric component, thereby functioning as an attachment member for attaching the microphone 5 to the wall portion (the ceiling 2' in this embodiment) of the vehicle interior. The loudspeaker 6 is supported by a support member 7. The roof portion 2 is formed by a plurality of members including an outer panel 2a (FIG. 1) exposed outside the vehicle, a wall member 2b which is an interior material forming the wall surface of the vehicle interior, and the support member 7. The wall member 2b includes an opening portion 2c which is covered by the cover member 4. In a state in which the cover member 4 is removed, the loudspeaker 6 and a part of the support member 7 are exposed to the vehicle interior through the opening portion 2c.

Figure 5:
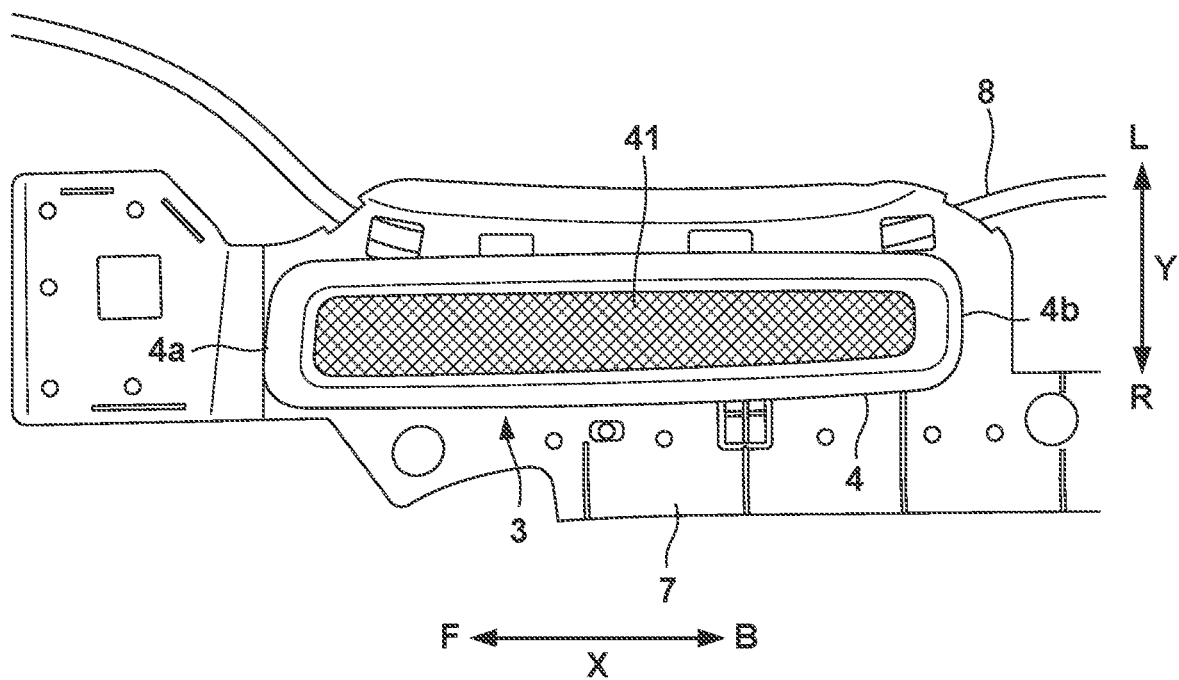
FIG. 5 is a front view showing the audio input/output unit and a wall member.
Figure 6:
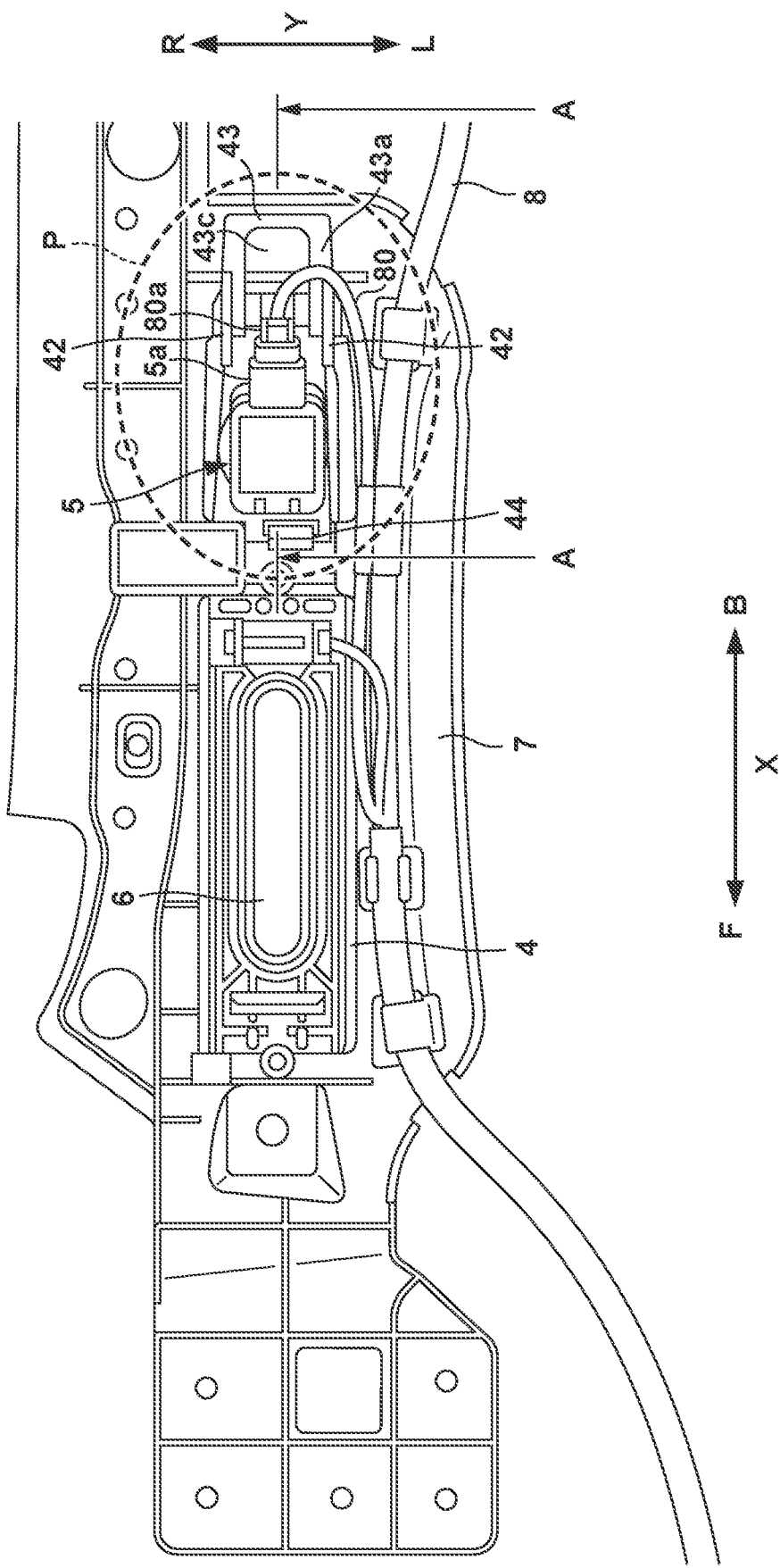
FIG. 6 is a back view showing the audio input/output unit and the wall member.

The support member 7 is a bracket which is arranged between the outer panel 2a and the wall member 2b and supports the loudspeaker 6 and the cover member 4. The support member 7 includes an opening portion 70, and a part of the microphone 5 supported by the cover member 4 enters the opening portion 70. FIG. 5 is a front view (a view viewed from the side of the vehicle interior) showing the audio input/output device 3 and the support member 7, and FIG. 6 is a back view (a view viewed from the vehicle outer side) showing the audio input/output device 3 and the support member 7. A harness 8 is supported by the support member 7. A part of the wiring of the harness 8 is connected to the loudspeaker 6, and the other part of the wiring 80 is connected to the microphone 5.

Figure 7:
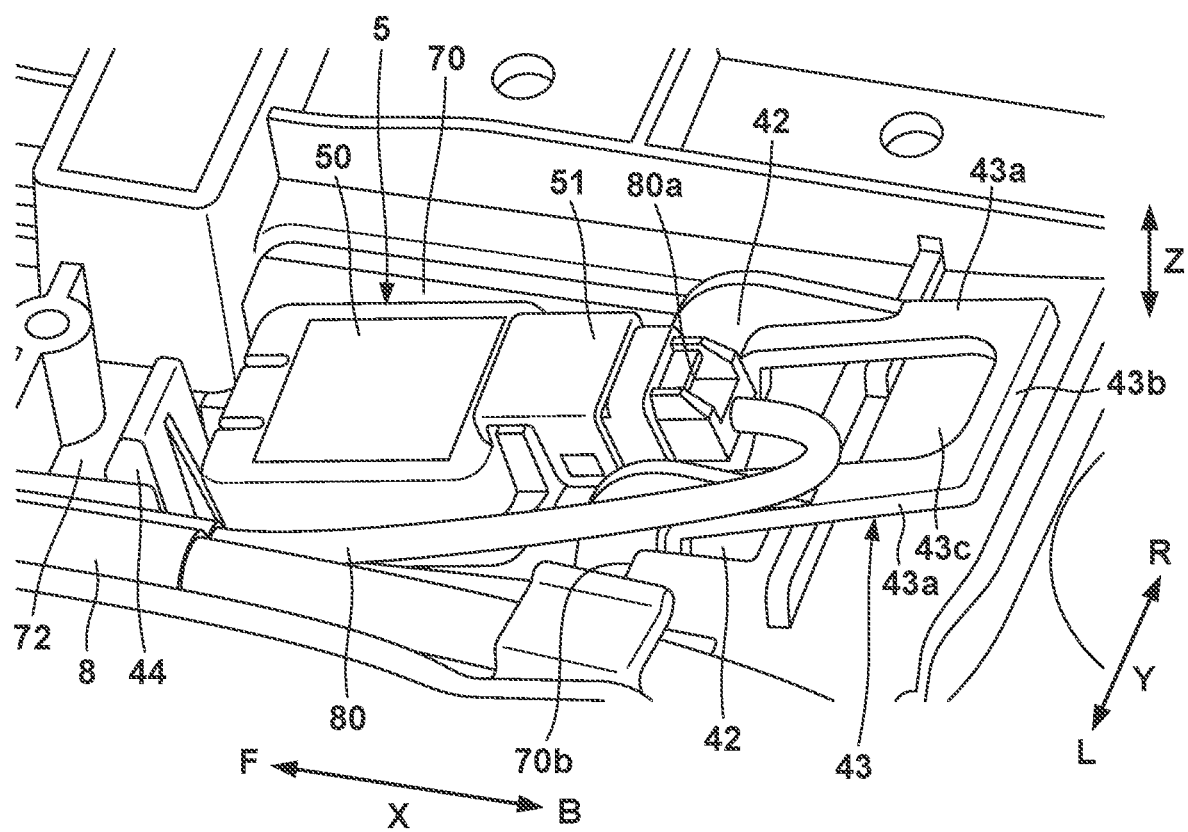
FIG. 7 is a partially perspective view showing the audio input/output unit and the wall member.
Figure 8:
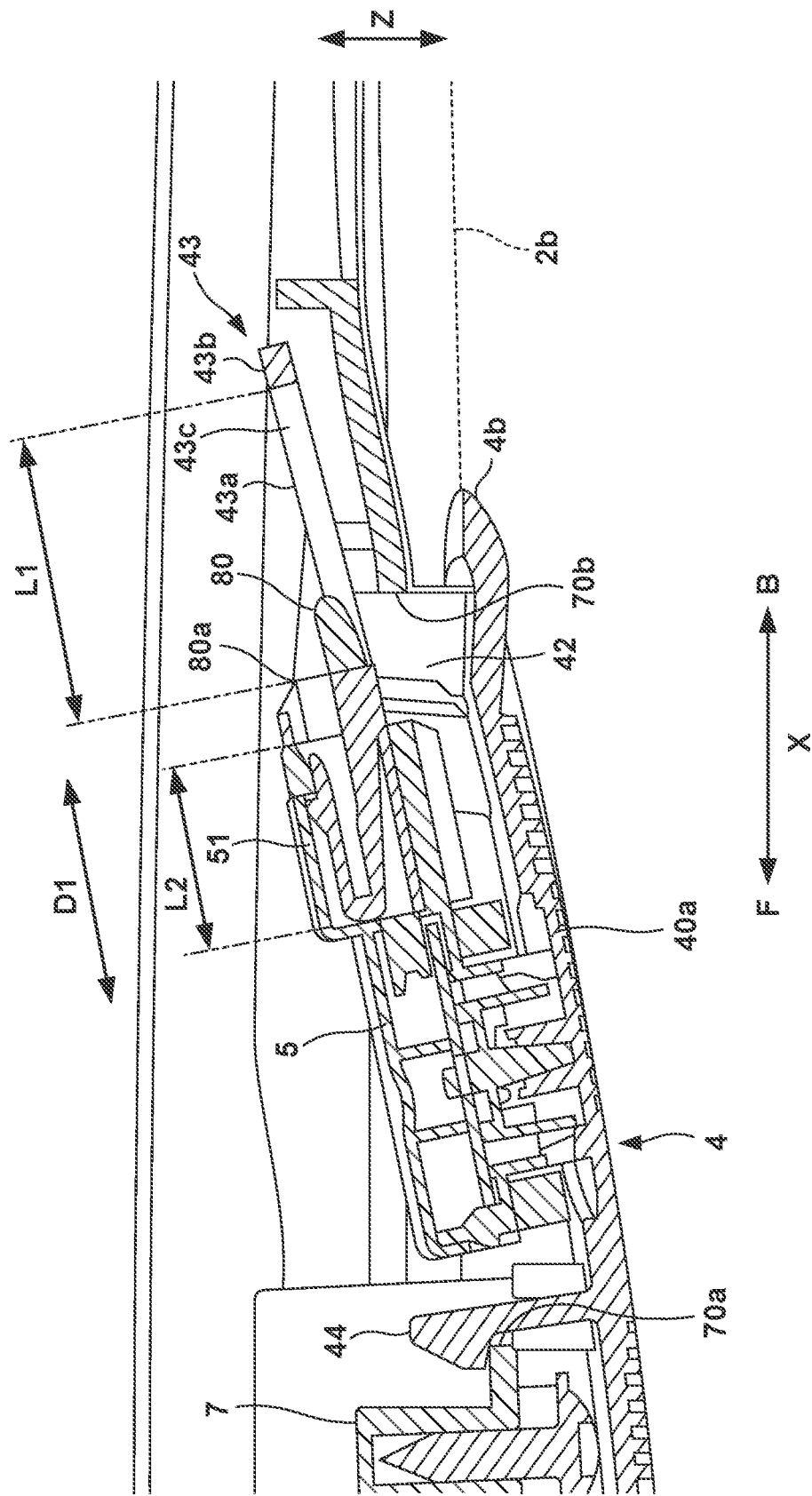
FIG. 8 is a sectional view taken along a line A-A in FIG. 6.
Figure 9:
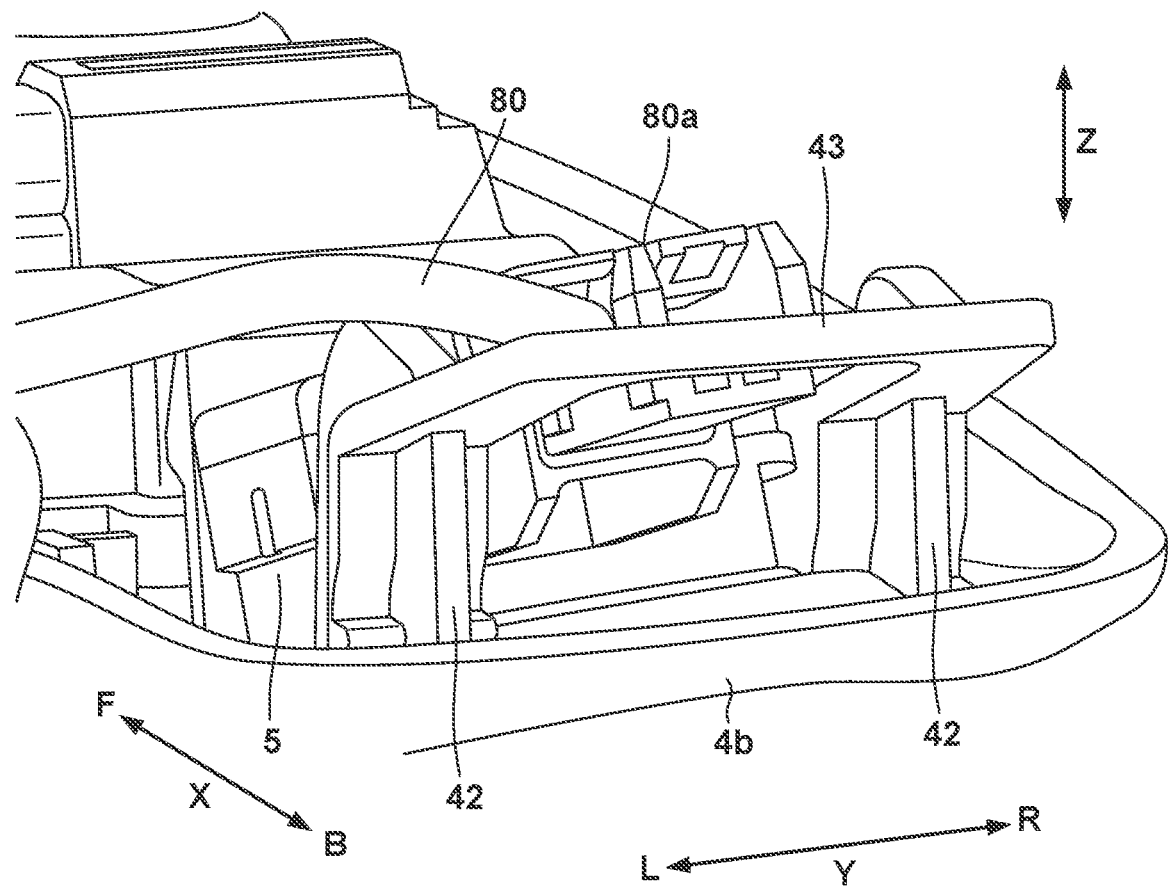
FIG. 9 is a view showing an end portion of the cover member.

With reference to FIGS. 4 to 9, the arrangement of the cover member 4 will be described. FIG. 7 is a perspective view showing the audio input/output device 3 and the support member 7 in the P portion shown in FIG. 6. FIG. 8 is a sectional view taken along a line A-A in FIG. 6. FIG. 9 is a perspective view showing the vicinity of an end portion 4b of the cover member 4 and the microphone 5.

The cover member 4 has a hull shape extending in the X direction as a whole, and includes a front-side end portion 4a and the rear-side end portion 4b. The cover member 4 includes a main body 40 and the mesh plate 41 fixed to the surface of the main body 40 and extending in the X direction. The main body 40 includes a base portion 40a extending in the X direction. The microphone 5 is fixed to the base portion 40a on the side of the end portion 4b. The base portion 40a includes a partially honeycomb-shaped opening portion which faces the loudspeaker 6, and the loudspeaker 6 communicates with the vehicle interior via the opening portion and the net plate 41. Note that although not shown, the base portion 40a includes an opening portion in the part facing the microphone 5, and the microphone 5 communicates with the vehicle interior via the opening portion.

The microphone 5 includes a main body 50 and a harness connecting portion 51 which is connected to the wiring 80 of the harness 8. The harness connecting portion 51 is detachably fitted with a connector 80a of the wiring 80. The insertion/extraction direction between the harness connecting portion 51 and the connector 80a is the D1 direction (FIG. 8). The D1 direction is the X direction inclined in the Z direction and orthogonal to the Y direction.

The cover member 4 includes engaging portions 42, 44, and 45 as portions for engaging with the wall portion (ceiling 2'). The engaging portion 45 is a tubular member arranged on the side of the end portion 4a in the X direction. A tapping screw (not shown) is screwed into the tubular portion of the engaging portion 45.

The engaging portion 44 is arranged slightly on the side of the end portion 4b in the intermediate portion between the end portion 4a and the end portion 4b in the X direction, and has a hook shape standing on the base portion 40a. The hook portion of the engaging portion 44 is bent toward the side of the end portion 4a in the X direction, and engages with a front-side edge portion 70a of the opening portion 70 of the support member 7.

Two engaging portions 42 are provided so as to be spaced apart from each other in the Y direction. The two engaging portions 42 are arranged so as to sandwich the harness connecting portion 51 of the microphone 5 and the connector 80a connected to the harness connecting portion 51. When viewed in the Y direction, the two connecting portions 42, the harness connecting portion 51, and the connector 80a overlap in the order of the engaging portion 42→the harness connecting portion 51 and the connector 80a→the engaging portion 42.

With this arrangement, the wiring 80 is routed around from the outer side to the inner side of the engaging portion 42 and connected to the harness connecting portion 51. This facilitates restricting movement of the wiring 80 to the engagement part between the engaging portion 42 and the wall portion 2'. The connector 80a is surrounded by the engaging portions 42 on the left and right sides, and this can improve the protection performance of the connector 80a and the wiring 80. In addition, the member length of the cover member 4 in the X direction can be shortened. Further, since the engagement strength of the cover member 4 with the ceiling 2' is high around the harness connecting portion 51, the harness connecting portion 51 is prevented from wobbling during traveling of the vehicle 1. As a result, it can be prevented that the harness connecting portion 51 and the connector 80a are unintentionally separated from each other.

Each engaging portion 42 is arranged on the side of the end portion 4b in the X direction, and has a hook shape standing on the base portion 40a. The hook portion of each engaging portion 42 is bent toward the side of the end portion 4b in the X direction, and engages with a rear-side edge portion 70b of the opening portion 70 of the support member 7 and an edge portion 2d of the opening portion 2c of the wall member 2b. Each engaging portion 42 includes a proximal-side end portion 42a and a distal end-side end portion 42b opposite to the proximal-side end portion 42a. The distal end-side end portion 42b engages with the edge portion 70b, so that the support member 7 and the wall member 2b are sandwiched between the distal end-side end portions 42b and the base portion 40a.

The cover member 4 further includes a coupling portion 43. The coupling portion 43 couples the distal end-side end portions 42b of the two engaging portions 42. In a state in which the cover member 4 is attached to the support member 7, the coupling portion 43 is located on the outer side of the vehicle 1 than the support member 7. The coupling portion 43 takes a role of restricting movement of the wiring 80 to the side of the base portion 40a during attachment work of the cover member 4.

The coupling portion 43 has a U-shape as a whole. The coupling portion 43 includes two portions 43a each extending from the distal end-side end portion 42b of each engaging portion 42, and a portion 43b coupling end portions of the two portions 43a. The portion 43a extends in a direction to separate from the harness connecting portion 51 and the connector 80a in the D1 direction. The portion 43b extends in the Y direction. A gap 43c is formed on the inner side of the coupling portion 43.

The connector 80a connected to the harness connecting portion 51 is located at the same position as the lower surface of the coupling portion 43 or above the lower surface. Therefore, the wiring 80 of the harness 8 is routed so as to cross over one of the two portions 43a (FIGS. 6 and 7). During attachment work of the cover member 4 to be described later, the wiring 80 can be prevented from being caught between the engaging portion 42 and the support member 7. Further, the wiring length of the wiring 80 can be shortened.

As shown in FIG. 8, the gap 43c has a length L1 in the D1 direction, and the fitting length of the connector 80a with respect to the harness connecting portion 51 is a length (stroke) L2. The length L1 and the length L2 have a relationship expressed by L1>L2, so that when the connector 80*a* is inserted/extracted into/from the harness connecting portion 51, it is possible to prevent the coupling portion 43 from interfering with the insertion/extraction work.

Figure 10:
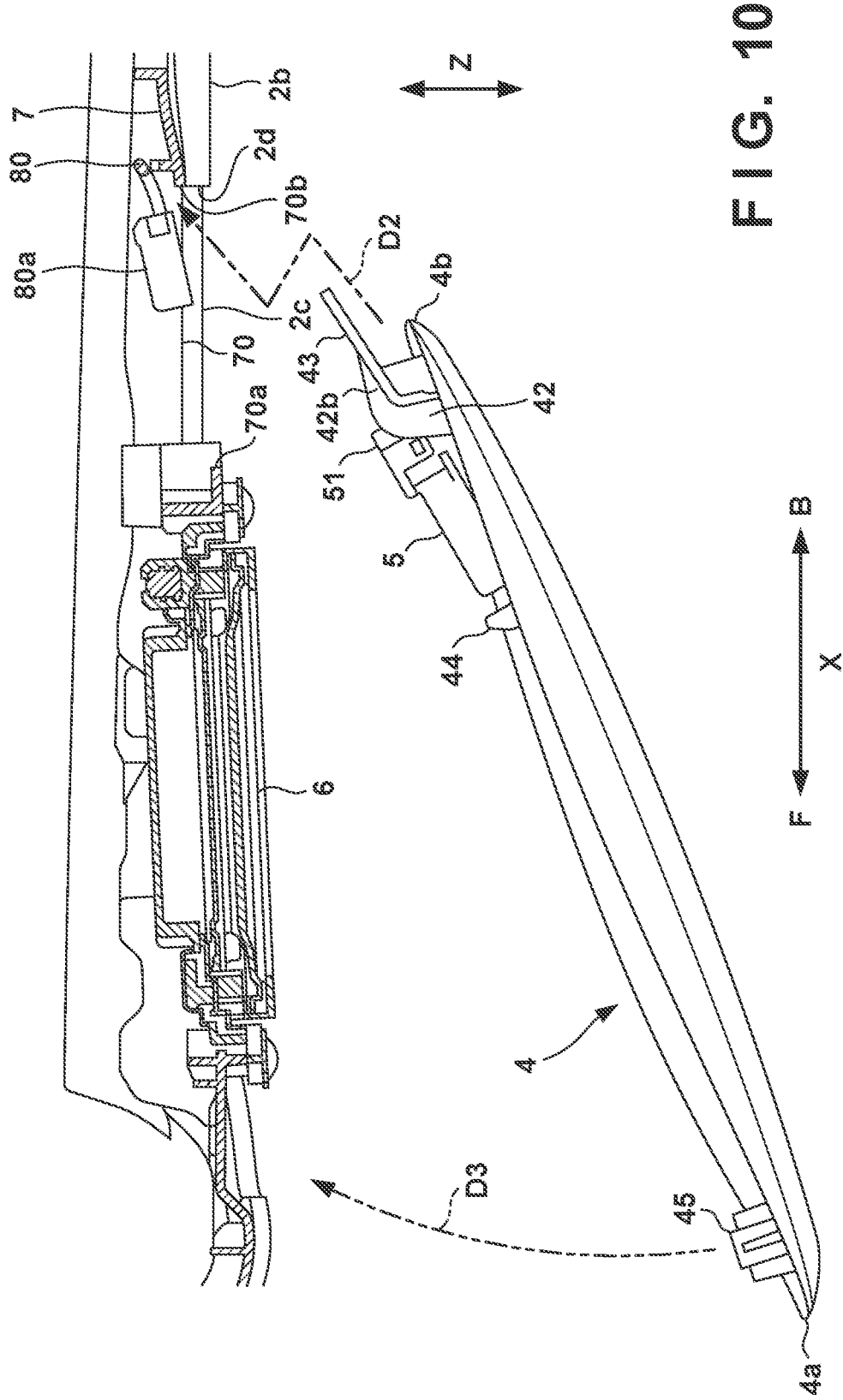
FIG. 10 is a view showing the attachment procedure of the cover member.

FIG. 10 is an explanatory view of attachment work of the cover member 4. The attachment work of the cover member 4 is performed from the vehicle interior side. First, connection work between the microphone 5 mounted on the cover member 4 and the wiring 80 is performed. More specifically, the connector 80*a* is inserted into the harness connecting portion 51. At this time, if the connection work is normally performed, the wiring 80 is located above the coupling portion 43 as shown in FIG. 9.

Then, the cover member 4 in an oblique posture with respect to the wall member 2*b* is inserted, from the side of the end portion 4*b*, into the opening portion 2*c* of the wall member 2*b* in the direction indicated by an arrow D2. This results in a mode in which the edge portion 70*b* of the support member 7 and the edge portion 2*d* of the wall member 2*b* are sandwiched between the distal end-side end portions 42*b* of the engaging portions 42 and the edge of the base portion 40*a* on the side of the end portion 4*b*. Thereafter, the cover member 4 is made to pivot in the direction indicated by an arrow D3 with the end portion 4*b* side as the pivot center, thereby attaching the cover member 4 to the wall member 2*b*. In the process of pivot of the cover member 4, after the engaging portion 44 engages with the edge portion 70*a*, a tapping screw (not shown) is screwed into the engaging portion 45. With the operation described above, the cover member 4 engages with and fixed to the ceiling 2', and the opening portion 2*c* of the wall member 2*b* is closed with the cover member 4.

During the attachment work, the coupling portion 43 restricts movement of the wiring 80 to the lower side of the coupling portion 43. Therefore, the wiring 80 can be prevented from being accidentally caught between the engaging portion 42 or the edge of the base portion 40*a* on the side of the end portion 4*b* and the edge portion 70*b* of the support member 7 or the edge portion 2*d* of the wall member 2*b*.

Other Embodiments

Figure 11:
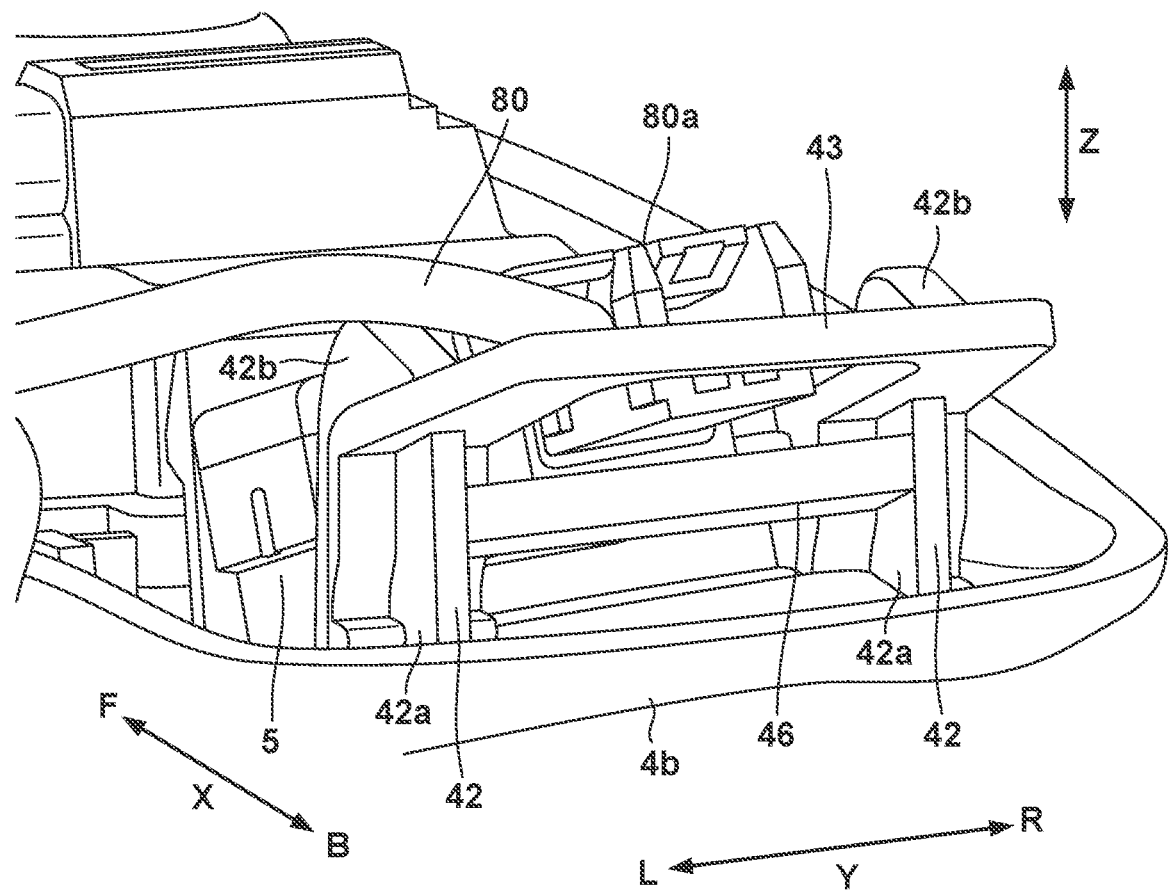
FIG. 11 is a view showing an end portion of a cover member according to another embodiment.

In the embodiment described above, during the attachment work of the cover member 4, movement of the wiring 80 to the lower side of the coupling portion 43 is restricted. However, if the worker is inexperienced, when the connector 80*a* is inserted into the harness connecting portion 51, he/she may insert the connector 80*a* into the harness connecting portion 51 from the lower side of the coupling portion 43. Therefore, as shown in FIG. 11, a coupling portion 46 may be provided. The coupling portion 46 couples intermediate portions (each of which is a portion between a proximal-side end portion 42*a* and a distal end-side end portion 42*b*) of engaging portions 42. Owing to the existence of the coupling portion 46, it becomes physically impossible to insert a connector 80*a* into a harness connecting portion 51 from the lower side of a coupling portion 43.

Further, in the embodiment described above, the microphone 5 has been exemplified as an electric component. However, an electric component to be attached to the wall portion of the vehicle interior with the structure according to this embodiment is not limited to the microphone 5. Further, the attachment part is not limited to the ceiling 2', and it may be the side wall or the like.

Summary of Embodiments

Each of the above-described embodiments discloses at least the attachment member or the vehicle described below.

1. An attachment member (4) according to the above-described embodiment is an attachment member configured to support an electric component (5) to which a harness (8, 80) is connected, and be attached to a wall portion (2') of a vehicle interior, the member comprising a base portion (40*a*) to which the electric component is fixed, and a first engaging portion (42) and a second engaging portion (42) each standing on the base portion and configured to engage with the wall portion, wherein each of the first engaging portion and the second engaging portion includes a proximal-side end portion (42*a*) on a side of the base portion, and a distal end-side end portion (42*b*) opposite to the proximal-side end portion, the first engaging portion and the second engaging portion are arranged so as to sandwich a harness connecting portion (51) of the electric component, and the attachment member further comprises a coupling portion (43) configured to couple the distal end-side end portion of the first engaging portion and the distal end-side end portion of the second engaging portion.

According to this embodiment, movement of the harness is restricted by the coupling portion, so that during attachment work of the electric component, the harness can be prevented from being accidentally caught.

2. In the above-described embodiment, the first engaging portion and the second engaging portion are spaced apart from each other in a first direction (Y), the harness is attachable/detachable to/from the harness connecting portion in a second direction (D1) orthogonal to the first direction, and when viewed in the first direction, the first engaging portion, the second engaging portion, and the harness connecting portion overlap each other.

According to this embodiment, the harness is routed around from the outer side to the inner side of one of the two engaging portions and connected to the harness connecting portion. This facilitates restricting movement of the harness to the engagement part between the engaging portion and the wall portion. Therefore, during attachment work of the electric component, the harness can be more effectively prevented from being accidentally caught.

3. In the above-described embodiment, the harness comprises a connector (80*a*) connected to the harness connecting portion, and when viewed in the first direction, the distal end-side end portion of the first engaging portion and the distal end-side end portion of the second engaging portion overlap the connector.

According to this embodiment, the protection performance of the connector and the harness can be improved by the first engaging portion and the second engaging portion.

4. In the above-described embodiment, the coupling portion has a U-shape including a first portion (43*a*) extending from the distal end-side end portion of the first engaging portion in a direction to separate from the connector, a second portion (43*a*) extending from the distal end-side end portion of the second engaging portion in a direction to separate from the connector, and a third portion (43*b*) configured to couple an end portion of the first portion and an end portion of the second portion, and a gap (43c, L1) from the connector to the third portion is larger than a fitting length (L2) of the connector with respect to the harness connecting portion.

In this embodiment, it is possible to restrict movement of the harness by the coupling portion without decreasing the insertion/extraction workability of the connector with respect to the harness connecting portion.

5. In the above-described embodiment, the harness (80) is routed so as to cross the first portion (43a).

According to this embodiment, it is possible to shorten the wiring length of the harness and, during attachment work of the electric component, the harness can be prevented from being accidentally caught.

6. The attachment member according to the above-described embodiment further comprises a second coupling portion (46) configured to couple an intermediate portion between the proximal-side end portion and the distal end-side end portion of the first engaging portion and an intermediate portion of the proximal-side end portion and the distal end-side end portion of the second engaging portion.

According to this embodiment, it can be prevented that the worker incorrectly routes and connects the harness to the harness connecting portion.

7. In the above-described embodiment, the electric component is a microphone, and the attachment member is a cover member configured to cover the microphone.

In this embodiment, during attachment work of the microphone, the harness can be prevented from being accidentally caught. In addition, the attachment member can be also used as the cover member.

8. A vehicle (1) according to the above-described embodiment is a vehicle that comprises an electric component (5), a harness (8, 80) connected to the electric component, and an attachment member (4) configured to support the electric component, the attachment member being attached to a wall portion (2') of a vehicle interior, wherein the attachment member comprises a base portion (40a) to which the electric component is fixed, and a first engaging portion (42) and a second engaging portion (42) each standing on the base portion and configured to engage with the wall portion, each of the first engaging portion and the second engaging portion includes a proximal-side end portion (42a) on a side of the base portion, and a distal end-side end portion (42b) opposite to the proximal-side end portion, the first engaging portion and the second engaging portion are arranged so as to sandwich a harness connecting portion (51) of the electric component, and the attachment member further comprises a coupling portion (43) configured to couple the distal end-side end portion of the first engaging portion and the distal end-side end portion of the second engaging portion.

According to this embodiment, movement of the harness is restricted by the coupling portion, so that during attachment work of the electric component, the harness can be prevented from being accidentally caught.

9. In the above-described embodiment, the vehicle comprises a wall member (2b) forming the wall portion, wherein the wall member includes an opening portion (2c) which is covered by the attachment member, and the first engaging portion and the second engaging portion engage with an edge portion (2d) of the opening portion.

According to this embodiment, the attachment member can close the opening portion with relatively simple work.

The invention is not limited to the foregoing embodiments, and various variations/changes are possible within the spirit of the invention.

What is claimed is:

1. An attachment member configured to support an electric component to which a harness is connected, and be attached to a wall portion of a vehicle interior, the member comprising:
   a base portion to which the electric component is fixed; and
   a first engaging portion and a second engaging portion each standing on the base portion and configured to engage with the wall portion;
   wherein each of the first engaging portion and the second engaging portion includes
   a proximal-side end portion on a side of the base portion, and
   a distal end-side end portion opposite to the proximal-side end portion,
   the first engaging portion and the second engaging portion are arranged so as to sandwich a harness connecting portion of the electric component, and
   the attachment member further comprises a coupling portion configured to couple the distal end-side end portion of the first engaging portion and the distal end-side end portion of the second engaging portion.

2. The member according to claim 1, wherein
   the first engaging portion and the second engaging portion are spaced apart from each other in a first direction,
   the harness is attachable/detachable to/from the harness connecting portion in a second direction orthogonal to the first direction, and
   when viewed in the first direction, the first engaging portion, the second engaging portion, and the harness connecting portion overlap each other.

3. The member according to claim 2, wherein
   the harness comprises a connector connected to the harness connecting portion, and
   when viewed in the first direction, the distal end-side end portion of the first engaging portion and the distal end-side end portion of the second engaging portion overlap the connector.

4. The member according to claim 3, wherein
   the coupling portion has a U-shape including
   a first portion extending from the distal end-side end portion of the first engaging portion in a direction to separate from the connector,
   a second portion extending from the distal end-side end portion of the second engaging portion in a direction to separate from the connector, and
   a third portion configured to couple an end portion of the first portion and an end portion of the second portion, and
   a gap from the connector to the third portion is larger than a fitting length of the connector with respect to the harness connecting portion.

5. The member according to claim 4, wherein
   the harness is routed so as to cross the first portion.

6. The member according to claim 1, further comprising
   a second coupling portion configured to couple an intermediate portion between the proximal-side end portion and the distal end-side end portion of the first engaging portion and an intermediate portion of the proximal-side end portion and the distal end-side end portion of the second engaging portion.

7. The member according to claim 1, wherein
the electric component is a microphone, and
the attachment member is a cover member configured to cover the microphone.

8. A vehicle that comprises an electric component, a harness configured to be connected to the electric component, and an attachment member configured to support the electric component, the attachment member being attached to a wall portion of a vehicle interior, wherein
the attachment member comprises
a base portion to which the electric component is fixed, and
a first engaging portion and a second engaging portion each standing on the base portion and configured to engage with the wall portion,
each of the first engaging portion and the second engaging portion includes
a proximal-side end portion on a side of the base portion, and
a distal end-side end portion opposite to the proximal-side end portion,
the first engaging portion and the second engaging portion are arranged so as to sandwich a harness connecting portion of the electric component, and
the attachment member further comprises a coupling portion configured to couple the distal end-side end portion of the first engaging portion and the distal end-side end portion of the second engaging portion.

9. The vehicle according to claim 8, further comprising a wall member forming the wall portion,
wherein the wall member includes an opening portion which is covered by the attachment member, and
the first engaging portion and the second engaging portion engage with an edge portion of the opening portion.

* * * * *